(12) United States Patent
Shimada

(10) Patent No.: US 10,032,936 B2
(45) Date of Patent: Jul. 24, 2018

(54) METHOD FOR MANUFACTURING RESISTIVE ELEMENT, METHOD FOR MANUFACTURING PRESSURE SENSOR ELEMENT, PRESSURE SENSOR ELEMENT, PRESSURE SENSOR, ALTIMETER, ELECTRONIC APPARATUS, AND MOVING OBJECT

(71) Applicant: Seiko Epson Corporation, Tokyo (JP)

(72) Inventor: Hiroyuki Shimada, Chuo (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 15/165,040

(22) Filed: May 26, 2016

(65) Prior Publication Data

US 2016/0347604 A1    Dec. 1, 2016

(30) Foreign Application Priority Data

May 29, 2015  (JP) .................................. 2015-109533
May 23, 2016  (JP) .................................. 2016-102803

(51) Int. Cl.
| | | |
|---|---|---|
| G01L 9/00 | (2006.01) | |
| G01L 1/18 | (2006.01) | |
| G01L 1/16 | (2006.01) | |
| G01L 9/06 | (2006.01) | |
| H01L 29/84 | (2006.01) | |
| H01L 21/74 | (2006.01) | |
| H01L 21/265 | (2006.01) | |
| H01L 21/266 | (2006.01) | |
| H01L 21/205 | (2006.01) | |
| H01L 41/08 | (2006.01) | |
| H01L 27/20 | (2006.01) | |

(Continued)

(52) U.S. Cl.
CPC ............ *H01L 29/84* (2013.01); *G01L 9/0042* (2013.01); *G01L 9/0054* (2013.01); *H01L 21/02532* (2013.01); *H01L 21/02634* (2013.01); *H01L 21/2053* (2013.01); *H01L 21/26513* (2013.01); *B81B 2201/0264* (2013.01); *B81B 2203/0127* (2013.01); *B81B 2207/07* (2013.01)

(58) Field of Classification Search
CPC ................. G01L 9/0054; G01L 9/0042; B81B 2201/0264
See application file for complete search history.

(56) References Cited

U.S. PATENT DOCUMENTS 5,591,679 A    1/1997  Jakobsen et al.
6,122,975 A *  9/2000  Sridhar ................. G01L 9/0042
                                                              73/754

(Continued)

FOREIGN PATENT DOCUMENTS

JP    07-131035 A    5/1995
JP    08-306936 A    11/1996

*Primary Examiner* — Victor A Mandala
*Assistant Examiner* — Regan J Rundio
(74) *Attorney, Agent, or Firm* — Harness, Dickey & Pierce, P.L.C.

(57) ABSTRACT

A method for manufacturing a resistive element includes: preparing a substrate including an n-type silicon layer; doping the silicon layer with an impurity to thereby form a resistive region; heat-treating the resistive region by any of rapid thermal annealing, flash lamp annealing, and excimer laser annealing; and epitaxially growing silicon on the resistive region to thereby form a covering layer.

18 Claims, 11 Drawing Sheets

(51) Int. Cl.
*B81B 7/00* (2006.01)
*H01L 21/02* (2006.01)

(56) References Cited

U.S. PATENT DOCUMENTS

| | | | |
|---|---|---|---|
| 6,263,740 B1* | 7/2001 | Sridhar | G01L 9/0042 |
| | | | 73/754 |
| 2008/0178680 A1* | 7/2008 | Jakobsen | B01D 65/10 |
| | | | 73/721 |
| 2015/0241465 A1* | 8/2015 | Konishi | G01P 15/0802 |
| | | | 73/514.33 |
| 2016/0004283 A1* | 1/2016 | Ganguly | G06F 1/1656 |
| | | | 307/118 |
| 2016/0033349 A1* | 2/2016 | Abed | G01L 9/0048 |
| | | | 257/419 |
| 2016/0236932 A1* | 8/2016 | Chau | B81C 1/00246 |

* cited by examiner

METHOD FOR MANUFACTURING RESISTIVE ELEMENT, METHOD FOR MANUFACTURING PRESSURE SENSOR ELEMENT, PRESSURE SENSOR ELEMENT, PRESSURE SENSOR, ALTIMETER, ELECTRONIC APPARATUS, AND MOVING OBJECT

CROSS REFERENCE

This application claims benefits of Japanese Application JP 2015-109533, filed on May 29, 2015 and Japanese Application JP2016-102803, filed on May 23, 2016. The disclosures of the prior applications are hereby incorporated by reference herein in their entirety.

BACKGROUND

1. Technical Field

The present invention relates to a method for manufacturing a resistive element, a method for manufacturing a pressure sensor element, a pressure sensor element, a pressure sensor, an altimeter, an electronic apparatus, and a moving object.

2. Related Art

In microelectromechanical systems (MEMS) (especially a sensor device), forming a resistive element (piezoresistive element) by doping single-crystal silicon with an impurity has been widely performed.

As a method for manufacturing the resistive element, for example, a method in which boron is implanted into an n-type silicon substrate while being accelerated to an energy of 1 MeV to thereby form a p-type resistive layer (resistive region) in a state where an n-type layer is left at a substrate surface has been known, as disclosed in JP-A-7-13103. According to the resistive element formed by burying the resistive layer by the method, the influence of an external electric field can be reduced.

However, in the method disclosed in JP-A-7-131035, since the resistive layer is formed to a relatively deep position, when, for example, the resistive element is used to detect the deflection of an extremely thin diaphragm, there is a problem in that it is difficult to bury the resistive layer in a state of being localized on one side of the diaphragm so as to enable efficient detection.

SUMMARY

An advantage of some aspects of the invention is to provide a method for manufacturing a resistive element and a method for manufacturing a pressure sensor element, by which an extremely thin resistive region can be formed in a state of being buried in an extremely shallow position. Another advantage of some aspects of the invention is to provide a pressure sensor element capable of achieving the miniaturization and high accuracy thereof. Still another advantage of some aspects of the invention is to provide a pressure sensor, an altimeter, an electronic apparatus, and a moving object including the pressure sensor element.

The advantages can be achieved by the following application examples of the invention.

Application Example 1

A method for manufacturing a resistive element according to this application example of the invention includes: preparing a substrate including a silicon layer including an n-type or p-type region; doping the region with an impurity to thereby form a resistive region; heat-treating the resistive region by any of rapid thermal annealing, flash lamp annealing, and excimer laser annealing; and epitaxially growing silicon on the resistive region to thereby form a covering layer.

According to the method for manufacturing a resistive element, the resistive region is heat-treated by any of rapid thermal annealing, flash lamp annealing, and excimer laser annealing. Therefore, a thermal budget (thermal history) is low, and the resistive region can be activated while the diffusion of an impurity is reduced to maintain the resistive region in a shallow position. Moreover, in the resistive element obtained, since the resistive region is covered by the covering layer and buried thereunder, the entry of noise into the resistive region can be reduced. In particular, the covering layer is formed by epitaxial growth, the resistive region can be buried in an extremely shallow position while the thickness of the resistive region is made extremely thin.

Application Example 2

In the method for manufacturing a resistive element according to the application example of the invention, it is preferable that, in the forming of the covering layer, the epitaxial growth is performed using disilane gas.

With this configuration, the covering layer can be formed at a relatively low temperature. Therefore, in the forming of the covering layer, the diffusion of the resistive region can be reduced.

Application Example 3

In the method for manufacturing a resistive element according to the application example of the invention, it is preferable that, in the heat-treating of the resistive region, the thickness of the resistive region after the heat treatment is in the range of from 0.1 to 2.0 µm.

With this configuration, when, for example, the resistive element is provided as a strain detecting element in a diaphragm portion that is deflected and deformed under pressure, even if the diaphragm portion is made extremely thin, the resistive region can be localized in the vicinity of the surface of the diaphragm portion, and thus the accuracy of detection by the resistive element can be made excellent.

Application Example 4

In the method for manufacturing a resistive element according to the application example of the invention, it is preferable that, in the forming of the covering layer, the thickness of the covering layer is in the range of from 0.05 to 0.4 µm.

With this configuration, when, for example, the resistive element is provided as a strain detecting element in a diaphragm portion that is deflected and deformed under pressure, even if the diaphragm portion is made extremely thin, the resistive region can be localized in the vicinity of the surface of the diaphragm portion, and thus the accuracy of detection by the resistive element can be made excellent.

Application Example 5

A method for manufacturing a pressure sensor element according to this application example of the invention includes: forming a resistive element using the method for manufacturing a resistive element according to the application example of the invention; and etching one surface side of the substrate to thereby form a diaphragm portion provided with the resistive element.

According to the method for manufacturing a pressure sensor element, in the pressure sensor element obtained, even when the diaphragm portion is made extremely thin, the resistive region can be localized in the vicinity of the surface of the diaphragm portion, and thus the accuracy of detection by the resistive element can be made excellent. Moreover, in the pressure sensor element obtained, since the resistive region is covered by the covering layer and buried thereunder, the entry of noise into the resistive region can be reduced. For these reasons, the miniaturization and high accuracy of the pressure sensor element obtained can be achieved.

Application Example 6

A pressure sensor element according to this application example of the invention includes a diaphragm portion, the diaphragm portion including a silicon layer, a resistive element including a resistive region including carriers in the silicon layer, the resistive element generating an electric signal in response to strain, and a covering layer on the resistive region, wherein the thickness of the resistive region is in the range of from 5 to 30% with respect to the thickness of the diaphragm portion, and a distance between a surface of the diaphragm portion on the covering layer side and a peak position of a carrier concentration of the resistive region is in the range of from 2 to 40% with respect to the thickness of the diaphragm portion.

According to the pressure sensor element, even when the diaphragm portion is made extremely thin, the resistive element can be localized in the vicinity of the surface of the diaphragm portion, and thus the accuracy of detection by the resistive element can be made excellent. Moreover, since the resistive region is covered by the covering layer and buried thereunder, the entry of noise into the resistive region can be reduced. For these reasons, the miniaturization and high accuracy of the pressure sensor element can be achieved.

Application Example 7

In the pressure sensor element according to the application example of the invention, it is preferable that the pressure sensor element further includes a pressure reference chamber provided on the covering layer side.

With this configuration, the pressure sensor element capable of detecting pressure using the pressure in the pressure reference chamber as a reference can be realized.

Application Example 8

In the pressure sensor element according to the application example of the invention, it is preferable that the thickness of the diaphragm portion is in the range of from 0.5 to 15 μm.

With this configuration, the pressure sensor element of small size can be realized.

Application Example 9

In the pressure sensor element according to the application example of the invention, it is preferable that the thickness of the resistive region is in the range of from 0.1 to 2.0 μm.

With this configuration, even when the diaphragm portion is made extremely thin, the resistive region can be localized in the vicinity of the surface of the diaphragm portion, and thus the accuracy of detection by the resistive element can be made excellent.

Application Example 10

In the pressure sensor element according to the application example of the invention, it is preferable that a distance between the surface of the diaphragm portion on the covering layer side and the peak position of a carrier concentration of the resistive region is in the range of from 0.05 to 0.4 μm.

With this configuration, even when the diaphragm portion is made extremely thin, the resistive region can be localized in the vicinity of the surface of the diaphragm portion, and thus the accuracy of detection by the resistive element can be made excellent.

Application Example 11

In the pressure sensor element according to the application example of the invention, it is preferable that the pressure sensor element further includes a substrate including the diaphragm portion and a circuit portion.

With this configuration, the pressure sensor element in which the diaphragm portion and the circuit portion are made into one chip can be realized.

Application Example 12

A pressure sensor according to this application example of the invention includes the pressure sensor element according to the application example of the invention.

According to the pressure sensor, the miniaturization and high accuracy of the pressure sensor element can be achieved.

Application Example 13

An altimeter according to this application example of the invention includes the pressure sensor element according to the application example of the invention.

According to the altimeter, the miniaturization and high accuracy of the pressure sensor element can be achieved.

Application Example 14

An electronic apparatus according to this application example of the invention includes the pressure sensor element according to the application example of the invention.

According to the electronic apparatus, the miniaturization and high accuracy of the pressure sensor element can be achieved.

Application Example 15

A moving object according to this application example of the invention includes the pressure sensor element according to the application example of the invention.

According to the moving object, the miniaturization and high accuracy of the pressure sensor element can be achieved.

BRIEF DESCRIPTION OF THE DRAWINGS

The invention will be described with reference to the accompanying drawings, wherein like numbers reference like elements.

FIGS. 4A and 4B are diagrams for explaining the operation of the pressure sensor element shown in FIG. 1, in which FIG. 4A is a cross-sectional view showing a pressurized state and FIG. 4B is a plan view showing the pressurized state.

DESCRIPTION OF EXEMPLARY EMBODIMENTS

Hereinafter, a pressure sensor element, a pressure sensor, an altimeter, an electronic apparatus, and a moving object according to the invention will be described in detail based on embodiments shown in the accompanying drawings.

1. Pressure Sensor Element

First Embodiment

Figure 1:
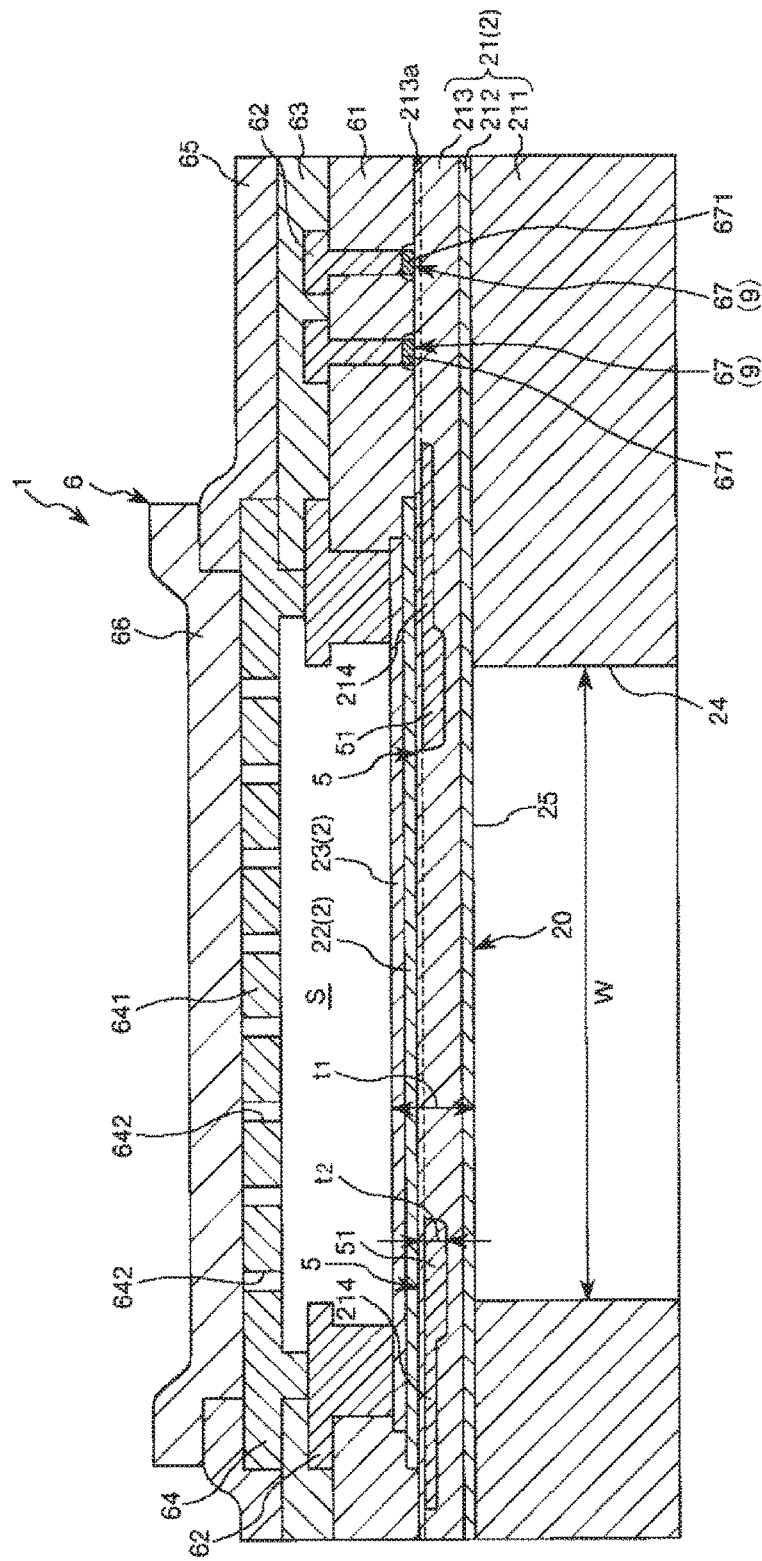
FIG. 1 is a cross-sectional view showing a pressure sensor element according to a first embodiment of the invention.
Figure 2:
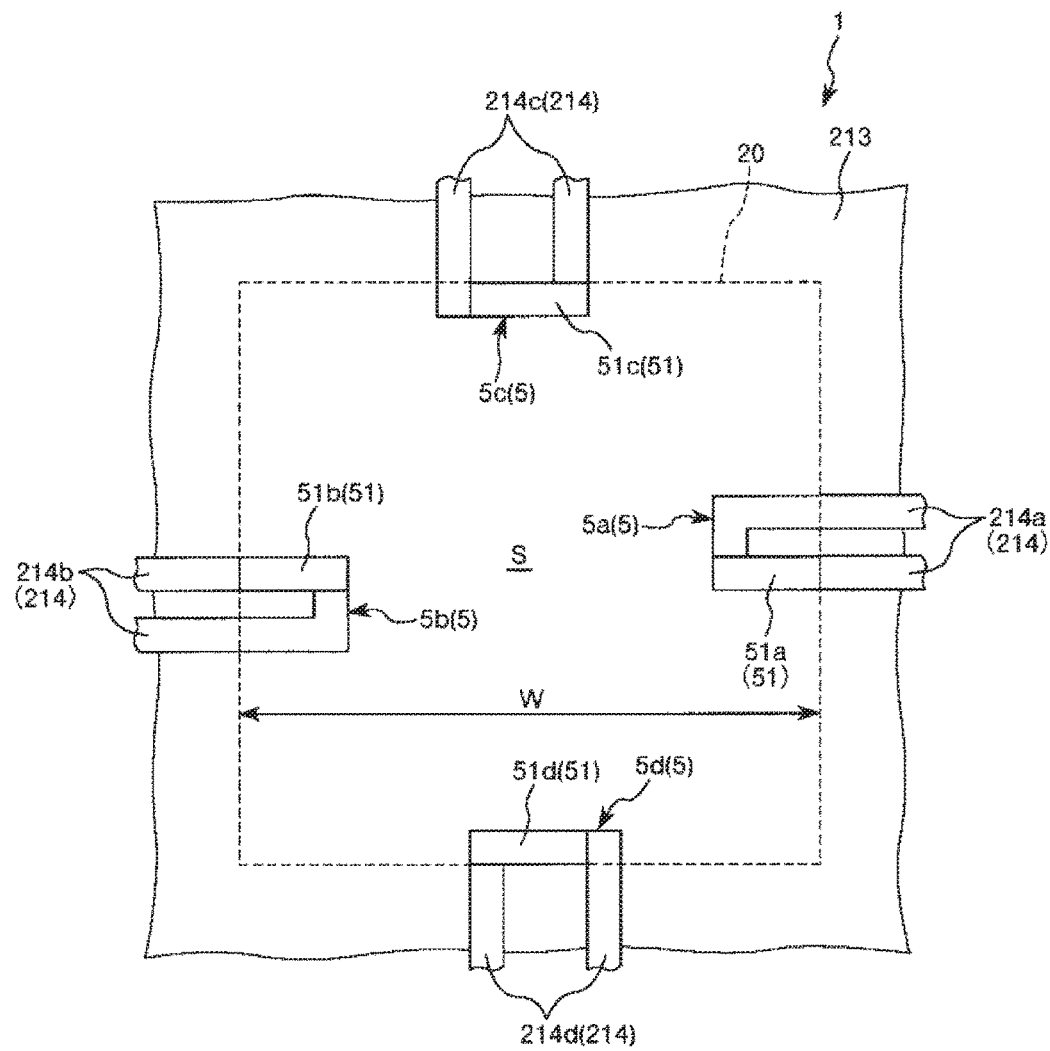
FIG. 2 is a plan view showing the arrangement of resistive elements included in the pressure sensor element shown in FIG. 1.
Figure 3:
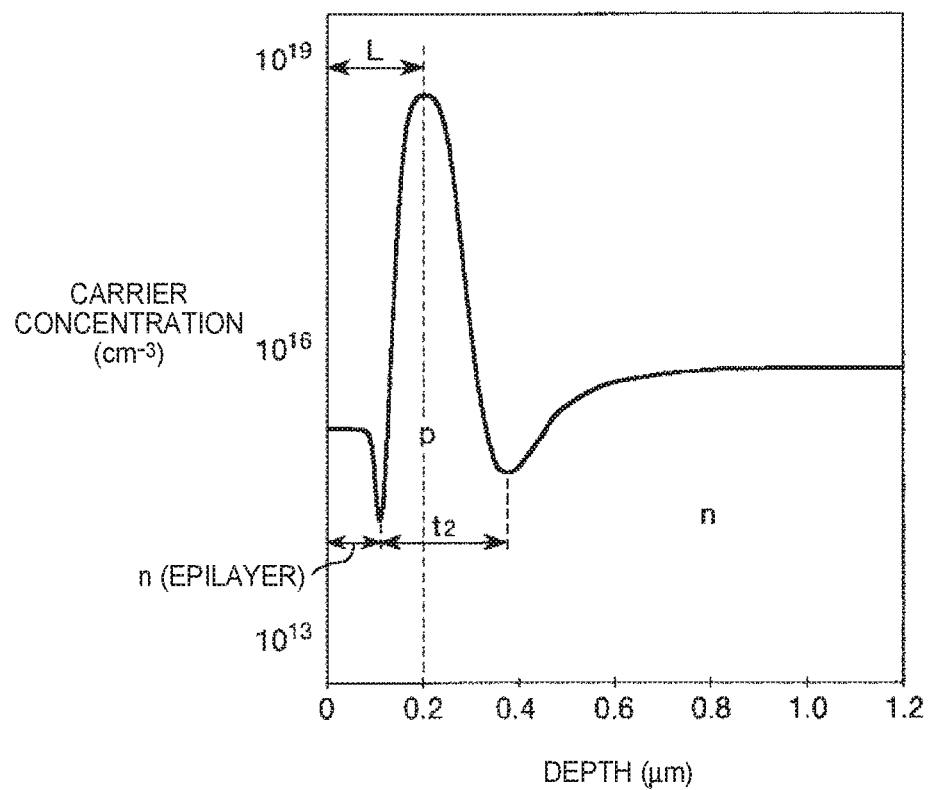
FIG. 3 is a graph showing an example of a carrier concentration distribution of a resistive region of the resistive element shown in FIG. 2.
Figure 4A:
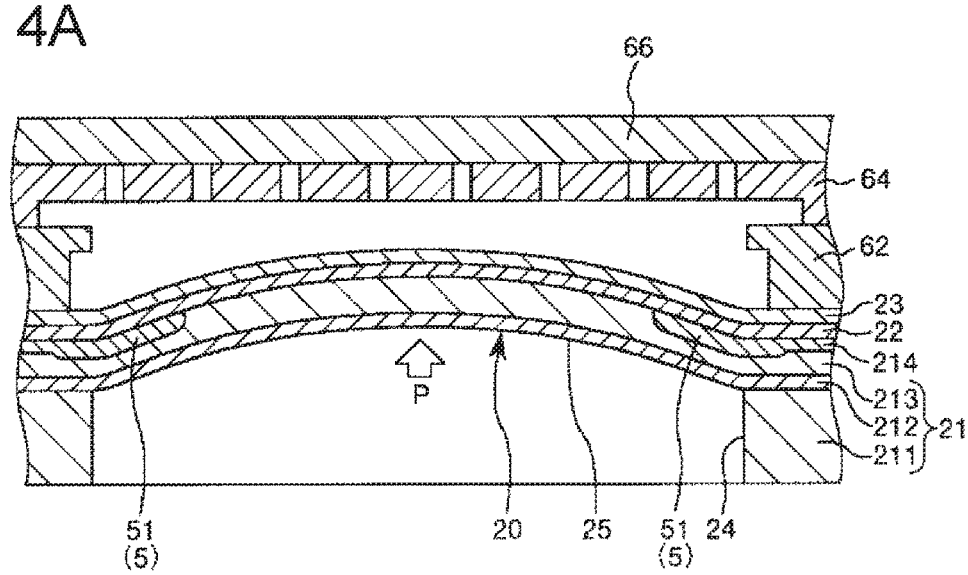
Figure 4B:
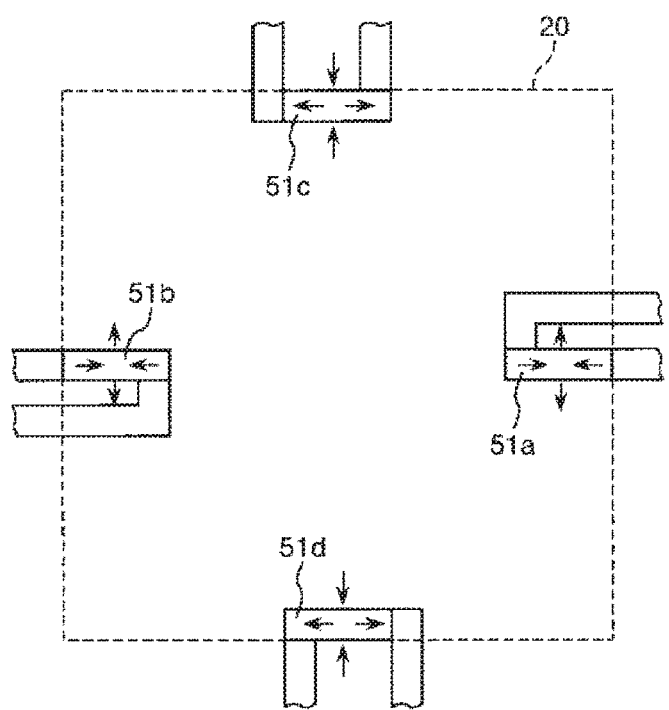

FIG. 1 is a cross-sectional view showing a pressure sensor element according to a first embodiment of the invention. FIG. 2 is a plan view showing the arrangement of resistive elements included in the pressure sensor element shown in FIG. 1. FIG. 3 is a graph showing an example of a carrier concentration distribution of a resistive region of the resistive element shown in FIG. 2. FIGS. 4A and 4B are diagrams for explaining the operation of the pressure sensor element shown in FIG. 1, in which FIG. 4A is a cross-sectional view showing a pressurized state and FIG. 4B is a plan view showing the pressurized state. In the following, the upper side in FIG. 1 is defined as "top", while the lower side is defined as "bottom", for convenience of description.

The pressure sensor element 1 shown in FIG. 1 includes a substrate 2 including a diaphragm portion 20, a plurality of piezoresistive elements 5 (resistive elements) provided in the diaphragm portion 20, a stacked structure 6 forming a cavity S (pressure reference chamber) together with the substrate 2, and a semiconductor circuit 9 (circuit portion).

The parts constituting the pressure sensor element 1 will be successively described below.

Substrate

The substrate 2 includes a semiconductor substrate 21, an insulating film 22 provided on one surface of the semiconductor substrate 21, and an insulating film 23 provided on a surface of the insulating film 22 on the side opposite to the semiconductor substrate 21.

The semiconductor substrate 21 is an SOI substrate in which a silicon layer 211 (handle layer) composed of single-crystal silicon, a silicon oxide layer 212 (BOX layer) composed of a silicon oxide film, and a silicon layer 213 (device layer) composed of single-crystal silicon are stacked in this order. The semiconductor substrate 21 is not limited to the SOI substrate, and may be, for example, any other semiconductor substrate such as a single-crystal silicon substrate.

The insulating film 22 is, for example, a silicon oxide film and has insulating properties. The insulating film 23 is, for example, a silicon nitride film, and has insulating properties and resistance to an etchant containing hydrofluoric acid. Here, since the insulating film 22 (silicon oxide film) intervenes between the semiconductor substrate 21 (the silicon layer 213) and the insulating film 23 (silicon nitride film), the transfer of stress generated in deposition of the insulating film 23 to the semiconductor substrate 21 can be reduced by the insulating film 22. Moreover, the insulating film 22 can be used as an element isolation film of the semiconductor circuit 9. The insulating films 22 and 23 are not limited to the constituent materials described above. Moreover, any one of the insulating films 22 and 23 may be omitted as necessary.

The substrate 2 is provided with the diaphragm portion 20, which is thinner than the surrounding portion and deflected and deformed under pressure. The diaphragm portion 20 is formed by providing a bottomed recess 24 in a lower surface of the semiconductor substrate 21. The lower surface of the diaphragm portion 20 is a pressure receiving surface 25. In the embodiment, as shown in FIG. 2, the diaphragm portion 20 has a square (rectangular) plan-view shape.

In the substrate 2 of the embodiment, the recess 24 penetrates the silicon layer 211, and the diaphragm portion 20 is composed of four layers, the silicon oxide layer 212, the silicon layer 213, the insulating film 22, and the insulating film 23. Here, the silicon oxide layer 212 can be used as an etching stop layer in forming the recess 24 by etching in a manufacturing step of the pressure sensor element 1 as will be described later, so that product-by-product variations in the thickness of the diaphragm portion 20 can be reduced.

The recess 24 may not penetrate the silicon layer 211, and the diaphragm portion 20 may be composed of five layers, a thin portion of the silicon layer 211, the silicon oxide layer 212, the silicon layer 213, the insulating film 22, and the insulating film 23.

Piezoresistive Element (Resistive Element)

The plurality of piezoresistive elements 5 are formed on the cavity S side of the diaphragm portion 20 as shown in FIG. 1. Here, the piezoresistive elements 5 are formed in the silicon layer 213 of the semiconductor substrate 21.

As shown in FIG. 2, the plurality of piezoresistive elements 5 include a plurality of piezoresistive elements 5a, 5b, 5c, and 5d disposed at the outer peripheral portion of the diaphragm portion 20.

The piezoresistive element 5a, the piezoresistive element 5b, the piezoresistive element 5c, and the piezoresistive element 5d are disposed corresponding to four sides of the diaphragm portion 20 having a quadrilateral shape in a plan view as viewed in the thickness direction of the substrate 2 (hereinafter referred to simply as "plan view").

The piezoresistive element 5a includes a resistive region 51a extending along a direction vertical to the corresponding side of the diaphragm portion 20. A pair of wires 214a are electrically connected to both end portions of the resistive region 51a. Similarly, the piezoresistive element 5b includes a resistive region 51b extending along a direction vertical to the corresponding side of the diaphragm portion 20. A pair of wires 214b are electrically connected to both end portions of the resistive region 51b.

On the other hand, the piezoresistive element 5c includes a resistive region 51c extending along a direction parallel to the corresponding side of the diaphragm portion 20. A pair of wires 214c are electrically connected to both end portions of the resistive region 51c. Similarly, the piezoresistive element 5d includes a resistive region 51d extending along a direction parallel to the corresponding side of the diaphragm portion 20. A pair of wires 214d are electrically connected to both end portions of the resistive region 51d.

Each of the wires 214a, 214b, 214c, and 214d includes, although not shown in the drawing, a portion exposed in the upper surface of the semiconductor substrate 21, and is electrically connected to the semiconductor circuit 9 via the portion.

In the following, the resistive regions 51a, 51b, 51c, and 51d are also referred to collectively as "resistive region 51"; and the wires 214a, 214b, 214c, and 214d are also referred to collectively as "wire 214".

The resistive region 51 and the wire 214 of the piezoresistive element 5 are each composed of, for example, silicon (single-crystal silicon) doped (diffused or implanted) with an impurity such as phosphorus (n-type) or boron (p-type) as carriers. Here, the doping concentration of impurity in the wire 214 is higher than the doping concentration of impurity in the resistive region 51. At least a portion of the wire 214 may be composed of metal.

The resistive region 51 and the wire 214 including the carriers are buried in the silicon layer 213 of the diaphragm portion 20. That is, the upper surfaces of the resistive region 51 and the wire 214 are covered by a covering layer 213a composed of single-crystal silicon of a conductivity type different from that of the resistive region 51 and the wire 214.

Here, the conductivity type of the resistive region 51 and the wire 214 is a conductivity type different from that of a portion of the silicon layer 213 other than the resistive region 51 and the wire 214. That is, when the resistive region 51 and the wire 214 are of p-type, the portion of the silicon layer 213 other than the resistive region 51 and the wire 214 is of n-type, and the covering layer 213a is also of n-type; while when the resistive region 51 and the wire 214 are of n-type, the portion of the silicon layer 213 other than the resistive region 51 and the wire 214 is of p-type, and the covering layer 213a is also of p-type. In this manner, a p-n junction is formed between the resistive region 51 and the wire 214, and the portion of the silicon layer 213 other than the resistive region 51 and the wire 214. Due to this, a leakage current from the resistive region 51 and the wire 214 can be reduced.

The conductivity type of the resistive region 51 and the wire 214 may be any of p-type and n-type, but is preferably p-type. Due to this, the detection sensitivity of the piezoresistive element 5 can be made excellent. In the following, a description will be given of the case where the resistive region 51 and the wire 214 are of p-type.

As shown in FIG. 3, a thickness $t_2$ of the resistive region 51 is the thickness of a p-type region and in the range of from 5 to 30% with respect to a thickness $t_1$ of the diaphragm portion 20. A distance L between a surface of the diaphragm portion 20 on the covering layer 213a side and a peak position of the carrier concentration of the resistive region 51 is in the range of from 2 to 40% with respect to the thickness $t_1$ of the diaphragm portion 20. Due to this, the resistive region 51 can be localized in the vicinity of the surface of the diaphragm portion 20 while the diaphragm portion 20 is made extremely thin, and thus the accuracy of detection by the piezoresistive element 5 can be made excellent. Moreover, since the resistive region 51 is buried, the entry of noise into the resistive region 51 can be reduced. For these reasons, the miniaturization and high accuracy of the pressure sensor element 1 can be achieved.

Here, the thickness $t_1$ of the diaphragm portion 20 is preferably in the range of from 0.5 to 15 μm, more preferably in the range of from 0.5 to 5 μm, and further preferably in the range of from 0.5 to 4 μm. Due to this, the diaphragm portion 20 can be deflected and deformed under pressure even when the width is reduced, and as a result, the pressure sensor element 1 of small size can be realized.

Moreover, the width w of the diaphragm portion 20 is preferably in the range of from 50 to 500 μm, more preferably in the range of from 50 to 200 μm, and further preferably in the range of from 80 to 200 μm. Due to this, the pressure sensor element 1 of small size can be realized.

The thickness $t_2$ of the resistive region 51 is preferably in the range of from 0.1 to 2.0 μm, more preferably in the range of from 0.1 to 1.0 μm, and further preferably in the range of from 0.1 to 0.5 μm. Due to this, the resistive region 51 can be localized in the vicinity of the surface of the diaphragm portion 20 while the diaphragm portion 20 is made extremely thin, and thus the accuracy of detection by the piezoresistive element 5 can be made excellent.

The distance L between the surface of the diaphragm portion 20 on the covering layer 213a side and the peak position of the carrier concentration of the resistive region 51 is preferably in the range of from 0.05 to 0.4 μm, more preferably in the range of from 0.1 to 0.4 μm, and further preferably in the range of from 0.1 to 0.3 μm. Due to this, even when the diaphragm portion 20 is made extremely thin, the resistive region 51 can be localized in the vicinity of the surface of the diaphragm portion 20, and thus the accuracy of detection by the piezoresistive element 5 can be made excellent.

The thickness of the covering layer 213a is preferably in the range of from 0.05 to 0.4 μm, more preferably in the range of from 0.05 to 0.20 μm, and further preferably in the range of from 0.05 to 0.10 μm. Due to this, even when the diaphragm portion 20 is made extremely thin, the entry of noise into the resistive region 51 can be reduced while the resistive region 51 is localized in the vicinity of the surface of the diaphragm portion 20.

The piezoresistive elements 5 described above constitute a bridge circuit (Wheatstone bridge circuit) via the wires 214 and the like. A driver circuit (not shown) that supplies a drive voltage is connected to the bridge circuit. The bridge circuit outputs a signal (voltage) in response to the resistance value of the piezoresistive elements 5. In this manner, the piezoresistive elements 5 generate an electric signal due to strain.

Here, the plurality of piezoresistive elements 5 are configured such that, for example, the resistance values thereof in a natural state are equal to each other.

Stacked Structure

The stacked structure 6 is formed so as to define the cavity S between the stacked structure 6 and the substrate 2 described above. Here, the stacked structure 6 is disposed on the piezoresistive element 5 side of the diaphragm portion 20, and defines and forms (constitutes) the cavity S (interior space) together with the diaphragm portion 20 (or the substrate 2).

The stacked structure 6 includes an inter-layer insulating film 61 formed on the substrate 2 so as to surround the piezoresistive elements 5 in the plan view, a wiring layer 62 formed on the inter-layer insulating film 61, an inter-layer insulating film 63 formed on the wiring layer 62 and the inter-layer insulating film 61, a wiring layer 64 formed on the inter-layer insulating film 63 and including a covering layer 641 provided with a plurality of fine pores 642 (openings), a surface protective film 65 formed on the wiring layer 64 and the inter-layer insulating film 63, and a sealing layer 66 provided on the covering layer 641.

The inter-layer insulating films 61 and 63 are each composed of, for example, a silicon oxide film. The wiring layers 62 and 64 and the sealing layer 66 are each composed of metal such as aluminum. The sealing layer 66 seals the fine pores 642 of the covering layer 641. The surface protective film 65 is, for example, a silicon nitride film.

The semiconductor circuit 9 is fabricated on and above the semiconductor substrate 21. The semiconductor circuit 9 includes active elements such as MOS transistors 67, and other circuit elements formed as necessary, such as capacitors, inductors, resistors, diodes, and wires (including portions of the wire 214 connected to the piezoresistive element 5 and the wiring layers 62 and 64). Here, the MOS transistor 67 includes a source and a drain (not shown) formed by doping the upper surface of the semiconductor substrate 21 with an impurity such as phosphorus or boron, a gate insulating film (not shown) formed on a channel region formed between the source and the drain, and a gate electrode 671 formed on the gate insulating film.

The stacked structure 6 and the semiconductor circuit 9 can be formed using a semiconductor manufacturing process such as a CMOS process.

As described above, since the substrate 2 includes the diaphragm portion 20 and the semiconductor circuit 9, the pressure sensor element 1 in which the diaphragm portion 20 and the semiconductor circuit 9 are made into one chip can be realized.

The cavity S defined by the substrate 2 and the stacked structure 6 is a hermetically sealed space. The cavity S functions as a pressure reference chamber provided on the side opposite to the pressure receiving surface 25 of the diaphragm portion 20 and providing a reference value of pressure that the pressure sensor element 1 detects. In the embodiment, the cavity S is in a vacuum state (300 Pa or less). By setting the cavity S into the vacuum state, the pressure sensor element 1 can be used as an "absolute pressure sensor" that detects pressure with the vacuum state as a reference, so that the convenience of the pressure sensor element 1 is improved.

However, the cavity S may not be in the vacuum state. The cavity S may be in an atmospheric pressure, a reduced-pressure state where the air pressure is lower than the atmospheric pressure, or a pressurized state where the air pressure is higher than the atmospheric pressure. Moreover, an inert gas such as nitrogen gas or noble gas may be sealed in the cavity S.

The configuration of the pressure sensor element 1 has been briefly described above.

In the pressure sensor element 1 having the configuration described above, the diaphragm portion 20 is deformed in response to pressure P received by the pressure receiving surface 25 of the diaphragm portion 20 as shown in FIG. 4A, whereby the piezoresistive elements 5a, 5b, 5c, and 5d are strained as shown in FIG. 4B and thus the resistance values of the piezoresistive elements 5a, 5b, 5c, and 5d change. With the change, an output of the bridge circuit composed of the piezoresistive elements 5a, 5b, 5c, and 5d changes, and based on the output, the magnitude of the pressure received by the pressure receiving surface 25 can be obtained.

More specifically, in the natural state prior to the occurrence of deformation of the diaphragm portion 20 described above, when, for example, the resistance values of the piezoresistive elements 5a, 5b, 5c, and 5d are equal to each other, the product of the resistance values of the piezoresistive elements 5a and 5b is equal to the product of the resistance values of the piezoresistive elements 5c and 5d, so that the output (potential difference) of the bridge circuit is zero.

On the other hand, when the deformation of the diaphragm portion 20 occurs as described above, a compressive strain along the longitudinal direction of the resistive regions 51a and 51b of the piezoresistive elements 5a and 5b and a tensile strain along the width direction thereof occur in the resistive regions 51a and 51b as shown in FIG. 4B, and at the same time, a tensile strain along the longitudinal direction of the resistive regions 51c and 51d of the piezoresistive elements 5c and 5d and a compressive strain along the width direction thereof occur in the resistive regions 51c and 51d. Hence, when the deformation of the diaphragm portion 20 occurs as described above, either the resistance values of the piezoresistive elements 5a and 5b or the resistance values of the piezoresistive elements 5c and 5d increase, and the other resistance values decrease.

Due to the strain of the piezoresistive elements 5a, 5b, 5c, and 5d, a difference occurs between the product of the resistance values of the piezoresistive elements 5a and 5b and the product of the resistance values of the piezoresistive elements 5c and 5d, and an output (potential difference) in response to the difference is output from the bridge circuit. Based on the output from the bridge circuit, the magnitude of the pressure (absolute pressure) received by the pressure receiving surface 25 can be obtained.

Here, when the deformation of the diaphragm portion 20 occurs as described above, either the resistance values of the piezoresistive elements 5a and 5b or the resistance values of the piezoresistive elements 5c and 5d increase, and the other resistance values decrease. Therefore, a change in the difference between the product of the resistance values of the piezoresistive elements 5a and 5b and the product of the resistance values of the piezoresistive elements 5c and 5d can be increased, and with the increase, the output from the bridge circuit can be increased. As a result, detection sensitivity for pressure can be enhanced.

According to the pressure sensor element 1 configured as described above, the resistive region 51 can be localized in the vicinity of the surface of the diaphragm portion 20 while the diaphragm portion 20 is made extremely thin, and thus the accuracy of detection by the piezoresistive element 5 can be made excellent. Moreover, since the resistive region 51 is covered by the covering layer 213a and buried thereunder, the entry of noise into the resistive region 51 can be reduced. For these reasons, the miniaturization and high accuracy of the pressure sensor element 1 can be achieved.

The pressure sensor element 1 configured as described above can be manufactured using a manufacturing method described below.

Method for Manufacturing Pressure Sensor Element

Next, a method for manufacturing a pressure sensor element according to the invention will be described using a method for manufacturing the pressure sensor element 1 described above as an example.

Figure 6:
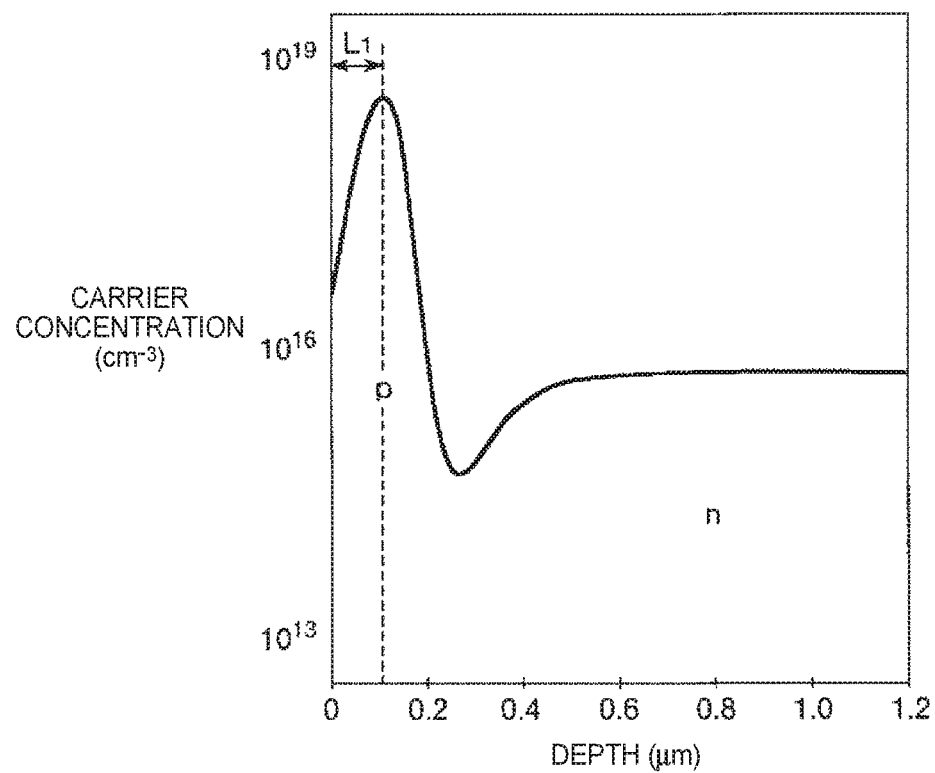
FIG. 6 is a graph showing an example of the carrier concentration distribution of the resistive element after annealing shown in FIG. 5C.
Figure 7A:
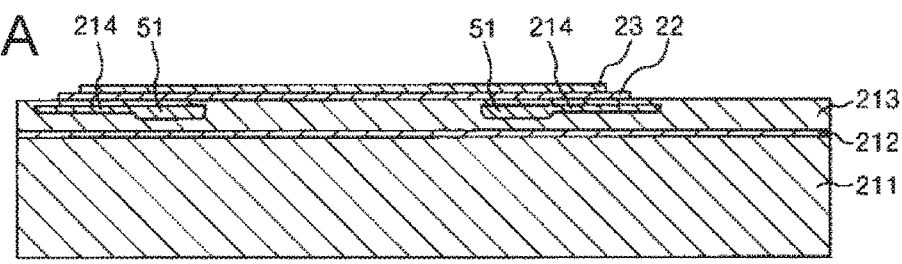
FIGS. 7A to 7C are diagrams showing a manufacturing step (forming step of insulating layers, a circuit portion, etc.) of the pressure sensor element shown in FIG. 1.
Figure 7B:
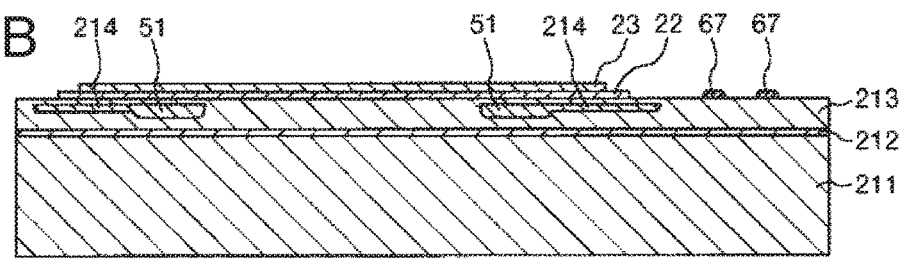
Figure 7C:
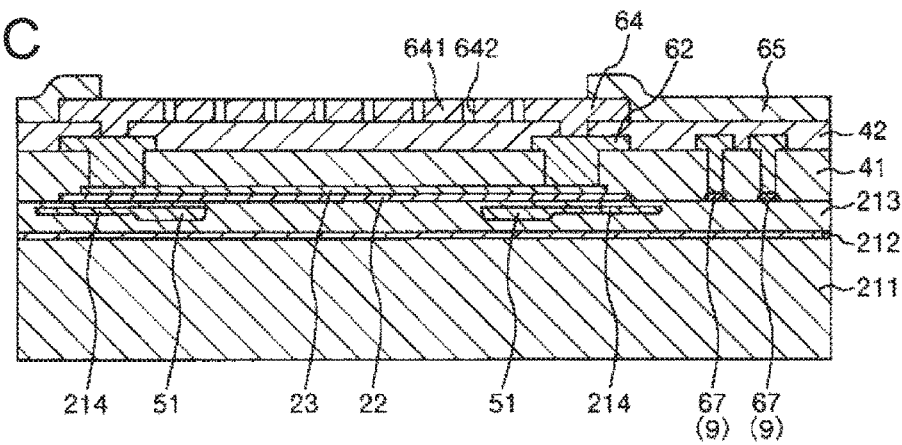
Figure 8A:
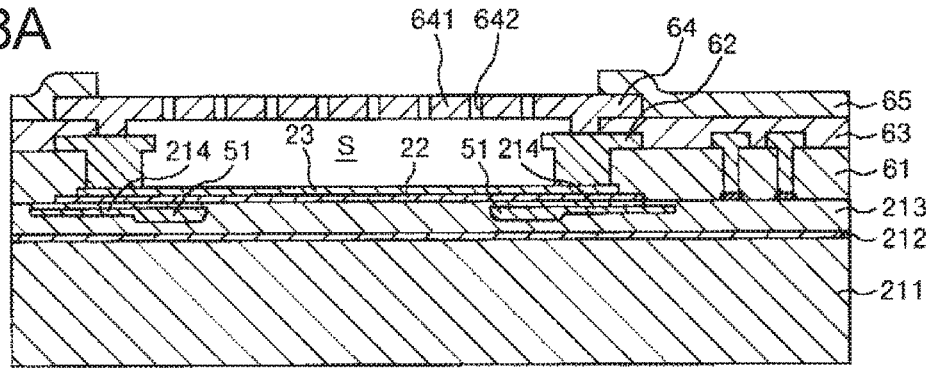
FIGS. 8A to 8C are diagrams showing a manufacturing step (forming step of a pressure reference chamber, a diaphragm portion, etc.) of the pressure sensor element shown in FIG. 1.
Figure 8B:
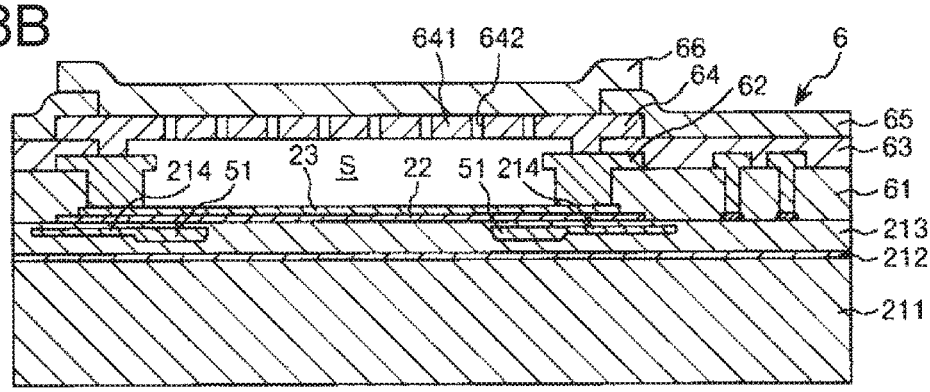
Figure 8C:
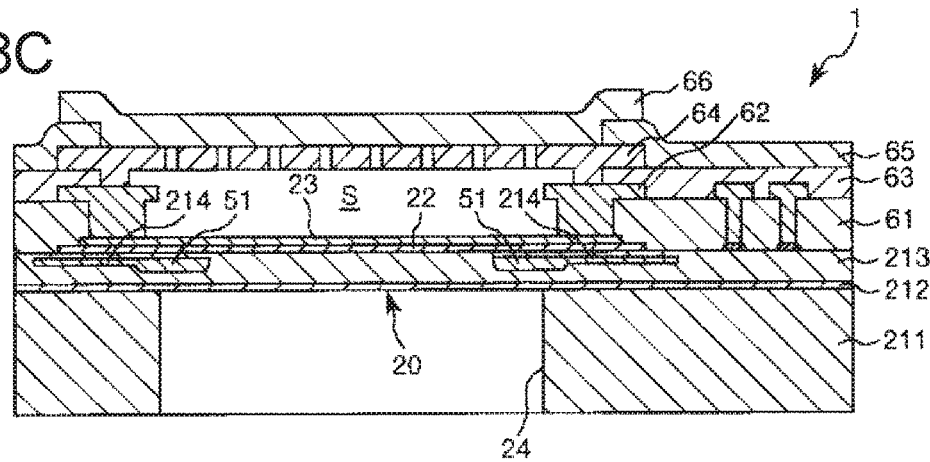

FIGS. 5A to 5D are diagrams showing a manufacturing step (forming step of the resistive element) of the pressure sensor element shown in FIG. 1. FIG. 6 is a graph showing an example of a carrier concentration distribution of the resistive element after annealing shown in FIG. 5C. FIGS. 7A to 7C are diagrams showing a manufacturing step (forming step of the insulating layers, the circuit portion, etc.) of the pressure sensor element shown in FIG. 1. FIGS. 8A to 8C are diagrams showing a manufacturing step (forming step of the pressure reference chamber, the diaphragm portion, etc.) of the pressure sensor element shown in FIG. 1.

The method for manufacturing the pressure sensor element 1 includes [1] a step of forming the piezoresistive element 5, [2] a step of forming the insulating films 22 and 23, [3] a step of forming the stacked structure 6 and the semiconductor circuit 9, and [4] a step of forming the diaphragm portion 20.

The steps will be successively described below.

[1] Step of Forming Piezoresistive Element (Method for Manufacturing Resistive Element)

1-1 Step of Preparing Substrate

Figure 5A:
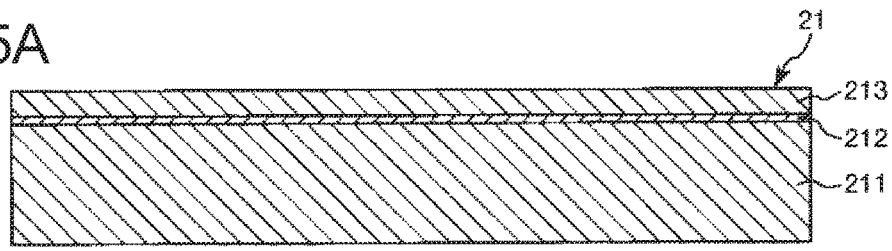
FIGS. 5A to 5D are diagrams showing a manufacturing step (forming step of the resistive element) of the pressure sensor element shown in FIG. 1.

First, as shown in FIG. 5A, the semiconductor substrate 21, which is an SOI substrate in which the silicon layer 211 (handle layer) composed of single-crystal silicon, the silicon oxide layer 212 (BOX layer) composed of a silicon oxide film, and the silicon layer 213 (device layer) composed of single-crystal silicon are stacked in this order, is prepared.

In this embodiment, the silicon layer 213 has a conductivity type of n-type.

1-2 Step of Forming Resistive Region

Figure 5B:
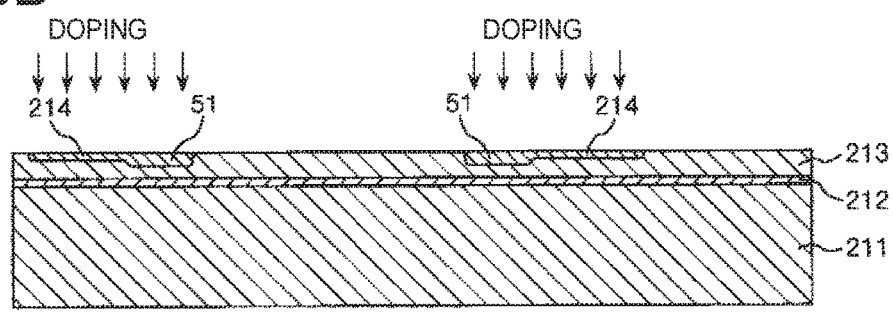

Then, the silicon layer 213 (n-type region) of the semiconductor substrate 21 is doped (ion implanted) with an impurity such as boron (p-type) to thereby form the plurality of resistive regions 51 and the wires 214 as shown in FIG. 5B.

For example, when ion implantation with boron is performed at +80 keV, an ion implantation concentration in the piezoresistive element 5 is approximately $1 \times 10^{14}$ atoms/cm$^2$. Moreover, an ion implantation concentration in the wire 214 is higher than that of the piezoresistive element 5. For example, when ion implantation with boron is performed at 10 keV, the ion implantation concentration in the wire 214 is approximately $5 \times 10^{15}$ atoms/cm$^2$.

1-3 Step of Heat Treatment

Figure 5C:
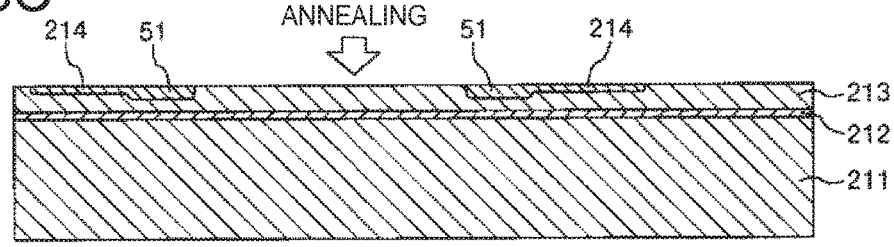

Next, as shown in FIG. 5C, the resistive region 51 and the wire 214 are heat-treated by annealing. Due to this, the resistive region 51 and the wire 214 are activated, so that the electrical characteristics of the resistive region 51 and the wire 214 can be made excellent.

In particular, the annealing used in this step 1-3 is any annealing (short-time annealing) of rapid thermal annealing (RTA), flash lamp annealing (FLA), and excimer laser annealing (ELA). Any of these annealings has a low thermal budget (thermal history). Therefore, with the use of any of these annealings, the diffusion of impurity can be reduced. Hence, it is possible to reduce an increase in the thickness of the resistive region 51 after the heat treatment or the movement of the peak position of the carrier concentration of the resistive region 51 to a deep position. Thus, the resistive region 51 can be activated while, for example, the resistive region 51 is maintained in a shallow position as shown in FIG. 6.

In contrast to this, when, for example, heat treatment is performed using furnace annealing with a furnace, a dopant is likely to be diffused because a thermal budget (thermal history) is high. Therefore, an increase in the thickness of the resistive region 51 after the heat treatment or the movement of the peak position of the carrier concentration of the resistive region 51 to a deep position is relatively large. Hence, even when the resistive region 51 is formed to be thin and in a shallow position in the step 1-2 described above, it is difficult to form the resistive region 51 that is thin and located in a shallow position. When the thickness of the diaphragm portion 20 is relatively thick, even if the resistive region 51 is relatively thick or located in a deep position, the resistive region 51 can be localized on the surface side of the diaphragm portion 20, and thus there is less concern. However, when the thickness of the diaphragm portion 20 is extremely thin, the resistive region 51 cannot be localized on the surface side of the diaphragm portion 20, and it becomes difficult to perform efficient detection with the piezoresistive element 5.

In the heat treatment of this step 1-3, the resistive region 51 and the wire 214 are heated to approximately 1000° C.

Moreover, in this step 1-3, the thickness $t_2$ of the resistive region 51 after the heat treatment is preferably in the range of from 0.1 to 2.0 μm, more preferably in the range of from 0.1 to 1.0 μm, and further preferably in the range of from 0.1 to 0.5 pt. Due to this, even when the diaphragm port ion 20 is made extremely thin (e.g., 4 μm or less), the resistive region 51 can be localized in the vicinity of the surface of the diaphragm portion 20, and thus the accuracy of detection by the piezoresistive element 5 can be made excellent.

Moreover, in this step 1-3, a distance $L_1$ between a peak position of a carrier concentration of the resistive region 51 after the heat treatment and the surface of the silicon layer 213 is preferably in the range of from 0.05 to 1.0 μm, more preferably in the range of from 0.05 to 0.5 μm, and further preferably in the range of from 0.05 to 0.25 μm. Due to this, even when the diaphragm portion 20 is made extremely thin (e.g., 4 μm or less), the resistive region 51 can be localized in the vicinity of the surface of the diaphragm portion 20, and thus the accuracy of detection by the piezoresistive element 5 can be made excellent.

1-4 Step of Forming Covering Layer

Figure 5D:
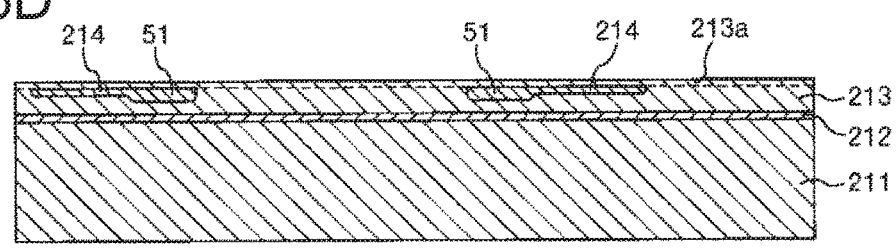

Next, as shown in FIG. 5D, the covering layer 213a is formed on the resistive region 51 and the wire 214.

The formation of the covering layer 213a is performed by epitaxially growing silicon. Due to this, the resistive region 51 and the wire 214 can be covered by the covering layer 213a and buried thereunder. Therefore, the entry of noise into the resistive region 51 and the wire 214 can be reduced. In particular, since the covering layer 213a is formed by epitaxial growth, the resistive region 51 can be buried in an extremely shallow position while the thickness of the resistive region 51 is made extremely thin, unlike the method disclosed in JP-A-7-131035.

Examples of the source gas used for the epitaxial growth performed in this step 1-4 include, but are not particularly limited to, for example disilane ($Si_2H_6$) gas and dichlorosilane ($SiH_2Cl_2$) gas, and disilane gas is preferably used. By performing the epitaxial growth using disilane gas, the covering layer 213a can be formed at a relatively low temperature (approximately 450° C.). Therefore, in the step 1-4 of forming the covering layer 213a, the diffusion of the resistive region 51 can be reduced.

Moreover, for example, by appropriately mixing a gas serving as a dopant such as phosphorus into the source gas in performing the epitaxial growth, the covering layer 213a of a desired conductivity type (n-type) or with a desired electrical conductivity can be formed. When the covering layer 213a of p-type is formed, a gas such as boron may be mixed into the source gas, for example.

Moreover, in this step 1-4, the thickness of the covering layer 213a is preferably in the range of from 0.05 to 0.4 μm, more preferably in the range of from 0.05 to 0.3 μm, and further preferably in the range of from 0.1 to 0.2 μm. Due to this, even when the diaphragm portion 20 is made extremely thin, the resistive region 51 can be localized in the vicinity of the surface of the diaphragm portion 20, and thus the accuracy of detection by the piezoresistive element 5 can be made excellent.

According to the method for manufacturing the piezoresistive element 5 described above, the resistive region 51 is heat-treated by any of rapid thermal annealing, flash lamp annealing, and excimer laser annealing. Therefore, a thermal budget (thermal history) is low, and the resistive region 51 can be activated while the diffusion of impurity is reduced to maintain the resistive region 51 in a shallow position. Moreover, in the piezoresistive element 5 obtained, since the resistive region 51 is covered by the covering layer 213a and buried thereunder, the entry of noise into the resistive region 51 can be reduced. In particular, since the covering layer 213a is formed by epitaxial growth, the resistive region 51 can be buried in an extremely shallow position while the thickness of the resistive region 51 is made extremely thin.

[2] Step of Forming Insulating Films 22 and 23

Next, as shown in FIG. 7A, the insulating film 22 and the insulating film 23 are formed in this order on the silicon layer 213.

The formation of the insulating films 22 and 23 can be each performed by, for example, a sputtering method, a CVD method, or the like.

[3] Step of Forming Stacked Structure 6 and Semiconductor Circuit 9

3-1 Formation of MOS Transistor 67

Next, as shown in FIG. 7B, the MOS transistors 67 are formed on the silicon layer 213.

Here, the formation of the MOS transistor 67 can be performed using a publicly known semiconductor manufacturing process.

3-2 Inter-Layer Insulating Film and Wiring Layer Forming Step

Next, as shown in FIG. 7C, a sacrificial layer 41, the wiring layer 62, a sacrificial layer 42, the wiring layer 64, and the surface protective film 65 are formed in this order so as to cover the insulating film 23, the MOS transistor 67, and the like.

Portions of the sacrificial layers 41 and 42 are removed by a cavity forming step described later, and the remaining portions thereof serve respectively as the inter-layer insulating films 61 and 63. The formation of each of the sacrificial layers 41 and 42 is performed by forming a silicon oxide film by a sputtering method, a CVD method, or the like, and patterning the silicon oxide film by etching.

The thickness of each of the sacrificial layers 41 and 42 is not particularly limited, but is, for example, approximately from 1500 to 5000 nm.

The formation of each of the wiring layers 62 and 64 is performed by, for example, forming a layer made of aluminum or the like by a sputtering method, a CVD method, or the like, and then processing the layer by patterning.

Here, the thickness of each of the wiring layers 62 and 64 is not particularly limited, but is, for example, approximately from 300 to 900 nm.

A stacked structure composed of the sacrificial layers 41 and 42 and the wiring layers 62 and 64 is formed using a common CMOS process, and the number of stacked layers is appropriately set as necessary. That is, still more sacrificial layers or wiring layers may be stacked as necessary.

The formation of the surface protective film 65 can be performed by, for example, a sputtering method, a CVD method, or the like. Due to this, in etching in a step 3-3 described later, the portions of the sacrificial layers 41 and 42 serving as the inter-layer insulating films 61 and 63 can be protected. Examples of the constituent material of the surface protective film 65 include, for example, those having resistance for protecting the element from moisture, dust, flaw, or the like, such as a silicon oxide film, a silicon nitride film, a polyimide film, and an epoxy resin film, and in particular, a silicon nitride film is suitably used. Although not shown in the drawing, when the surface protective film 65 including the silicon oxide film and silicon nitride film described above is formed, the silicon oxide film and the silicon nitride film are uniformly formed in this order, and thereafter, these layers are patterned. The thickness of the surface protective film 65 is not particularly limited, but is, for example, approximately from 500 to 2000 nm.

3-3 Cavity Forming Step

Next, by removing portions of the sacrificial layers 41 and 42, the cavity S is formed between the insulating film 23 and the covering layer 641 as shown in FIG. 8A. Due to this, the inter-layer insulating films 61 and 63 are formed.

The formation of the cavity S is performed by removing portions of the sacrificial layers 41 and 42 by etching through the plurality of fine pores 642 formed in the covering layer 641. Here, when wet etching is used as the etching, an etchant such as hydrofluoric acid or buffered hydrofluoric acid is supplied through the plurality of fine pores 642; while when dry etching is used, an etching gas such as hydrofluoric acid gas is supplied through the plurality of fine pores 642. In the etching, the insulating film 23 functions as an etching stop layer. Moreover, since the insulating film 23 has resistance to an etchant, the insulating film 23 also has a function of protecting the constituent portion (e.g., the insulating film 22, the piezoresistive element 5, the wire 214, etc.) below the insulating film 23 against the etchant.

3-4 Sealing Step

Next, as shown in FIG. 8B, the sealing layer 66 composed of a silicon oxide film, a silicon nitride film, or a metal film such as Al, Cu, W, Ti, or TiN is formed on the covering layer 641 by a sputtering method, a CVD method, or the like to seal the fine pores 642. Due to this, the cavity S is sealed by the sealing layer 66, so that the stacked structure 6 is obtained.

Here, the thickness of the sealing layer 66 is not particularly limited, but is, for example, approximately from 1000 to 5000 nm.

[4] Step of Forming Diaphragm Portion 20

Next, after the lower surface of the silicon layer 211 is ground as necessary, the recess 24 is formed as shown in FIG. 8C by removing (processing) a portion of the lower surface (one surface side) of the silicon layer 211 by etching. Due to this, the diaphragm portion 20 is formed.

Here, in removing a portion of the lower surface of the silicon layer 211, the silicon oxide layer 212 functions as an etching stop layer. Due to this, the thickness of the diaphragm portion 20 can be defined with high accuracy.

The method of removing a portion of the lower surface of the silicon layer 211 may be dry etching, wet etching, or the like.

Through the steps described above, the pressure sensor element 1 can be manufactured.

According to the method for manufacturing the pressure sensor element 1 described above, in the pressure sensor element 1 obtained, even when the diaphragm portion 20 is made extremely thin, the resistive region 51 can be localized in the vicinity of the surface of the diaphragm portion 20, and thus the accuracy of detection by the piezoresistive element 5 can be made excellent. Moreover, in the pressure sensor element 1 obtained, since the resistive region 51 is covered by the covering layer 213a and buried thereunder, the entry of noise into the resistive region 51 can be reduced. For these reasons, the miniaturization and high accuracy of the pressure sensor element 1 obtained can be achieved.

Second Embodiment

Figure 9:
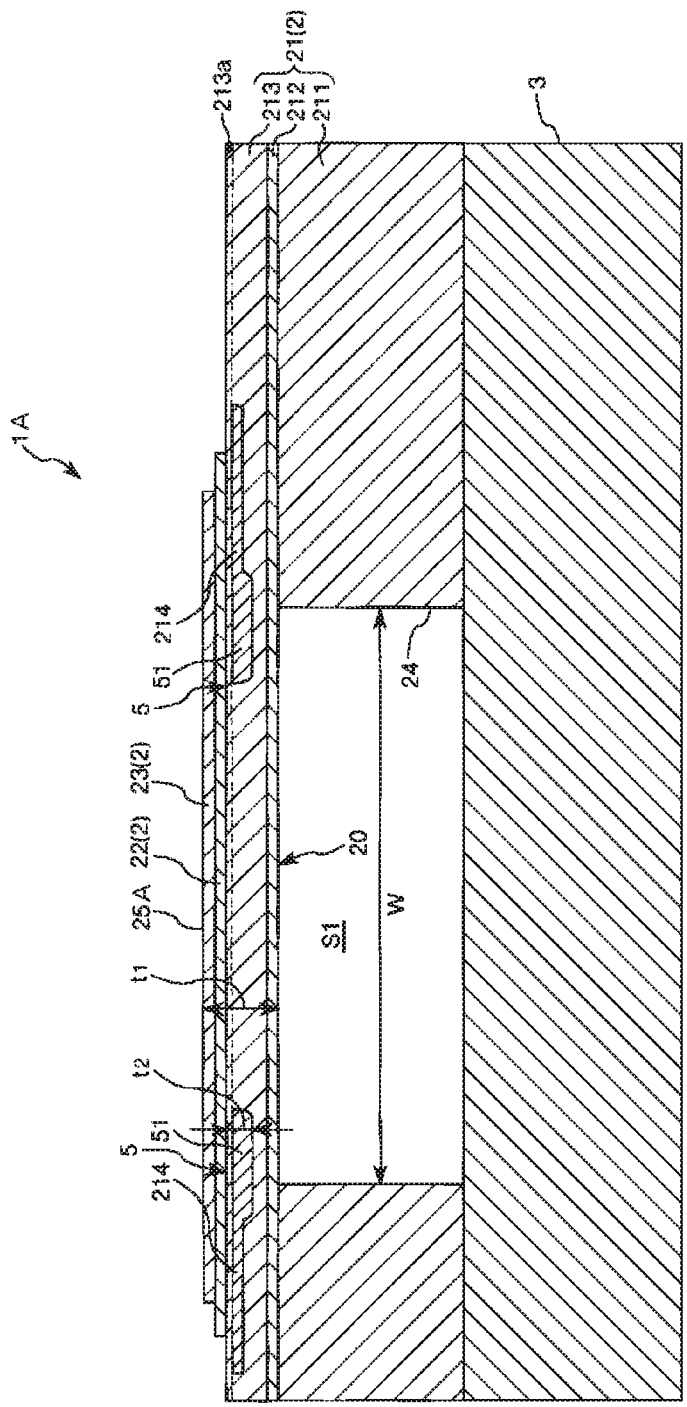
FIG. 9 is a cross-sectional view showing a pressure sensor element according to a second embodiment of the invention.

FIG. 9 is a cross-sectional view showing a pressure sensor element according to a second embodiment of the invention.

The pressure sensor element of the embodiment is similar to that of the first embodiment except that the configuration (arrangement) of the pressure reference chamber is different.

In the following description, the second embodiment will be described mainly on differences from the embodiment described above, and a description of similar matters is omitted. Moreover, in FIG. 9, configurations similar to those of the embodiment described above are denoted by the same reference and numeral signs.

The pressure sensor element 1A shown in FIG. 9 includes, instead of the stacked structure 6 of the first embodiment, a substrate 3 forming a cavity S1 (pressure reference chamber) together with the substrate 2. Here, the substrate 3 closes the opening of the recess 24 of the substrate 2 and is bonded to the lower surface (surface of the silicon layer 211) of the substrate 2. By air-tightly sealing the recess 24 with the substrate 3 as described above, the cavity S1 as a pressure reference chamber is formed. The substrate is not particularly limited as long as the cavity S1 functioning as a pressure reference chamber can be formed, and, for example, a silicon substrate, a glass substrate, a ceramics substrate, or the like can be used. Moreover, the substrate 3 is sufficiently thick with respect to the diaphragm portion 20 so that a portion of the substrate 3 facing the diaphragm portion 20 via the cavity S1 is not deformed due to a pressure difference (difference between the pressure in the cavity S1 and ambient pressure).

Here, in the embodiment as described above, since the cavity S1 functioning as a pressure reference chamber is provided on the silicon layer 211 side of the substrate 2, a surface of the diaphragm portion 20 on the side opposite to the cavity S1 is a pressure receiving surface 25A.

In FIG. 9, a circuit portion is not shown. However, a circuit portion similar to the semiconductor circuit 9 of the first embodiment described above may be provided, or a circuit portion may be provided outside the pressure sensor element 1A.

Also according to the second embodiment described above, similarly to the first embodiment, the resistive region 51 can be localized in the vicinity of the surface of the diaphragm portion 20 while the diaphragm portion 20 is made extremely thin, and thus the accuracy of detection by the piezoresistive element 5 can be made excellent. Moreover, since the resistive region 51 is covered by the covering layer 213a and buried thereunder, the entry of noise into the resistive region 51 can be reduced. For these reasons, the miniaturization and high accuracy of the pressure sensor element 1A can be achieved.

2. Pressure Sensor

Figure 10:
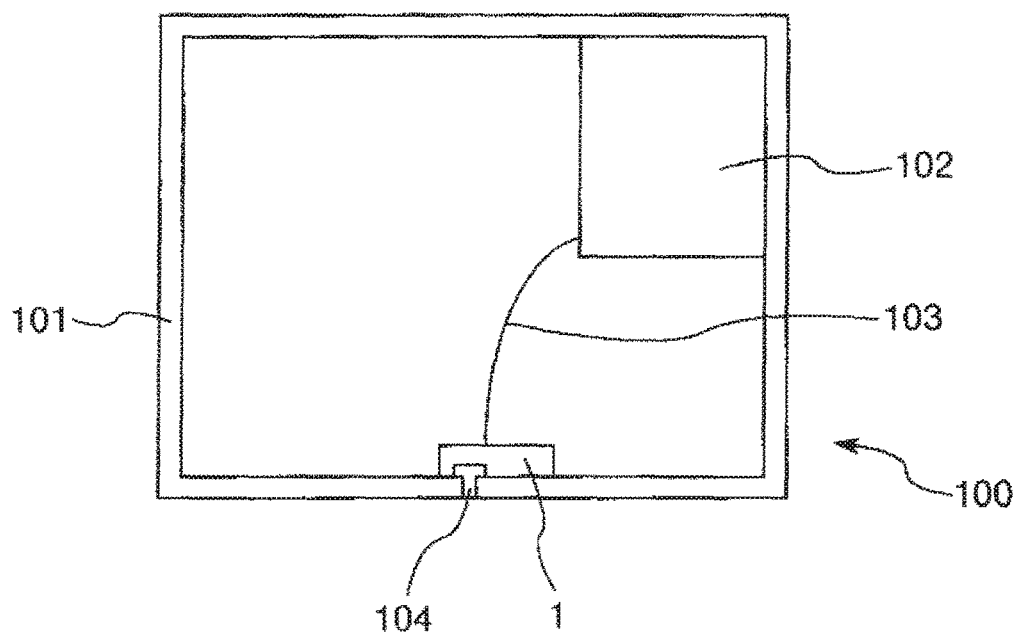
FIG. 10 is a cross-sectional view showing an example of a pressure sensor according to the invention.

Next, a pressure sensor (pressure sensor according to the invention) including the pressure sensor element according to the invention will be described. FIG. 10 is a cross-sectional view showing an example of the pressure sensor according to the invention.

As shown in FIG. 10, a pressure sensor 100 according to the invention includes the pressure sensor element 1, a housing 101 that accommodates the pressure sensor element 1, and an arithmetic portion 102 that calculates pressure data from a signal obtained from the pressure sensor element 1. The pressure sensor element 1 is electrically connected with the arithmetic portion 102 via a wire 103.

The pressure sensor element 1 is fixed inside the housing 101 by a fixing unit (not shown). The housing 101 includes a through-hole 104 for the diaphragm portion 20 of the pressure sensor element 1 to communicate with, for example, the atmosphere (the outside of the housing 101).

According to the pressure sensor 100, the diaphragm portion 20 receives pressure through the through-hole 104. The signal output from the pressure sensor element 1 under the pressure is transmitted to the arithmetic portion via the wire 103, and the pressure data is calculated. The calculated pressure data can be displayed through a display portion (not shown; e.g., a monitor of a personal computer, etc.).

3. Altimeter

Figure 11:
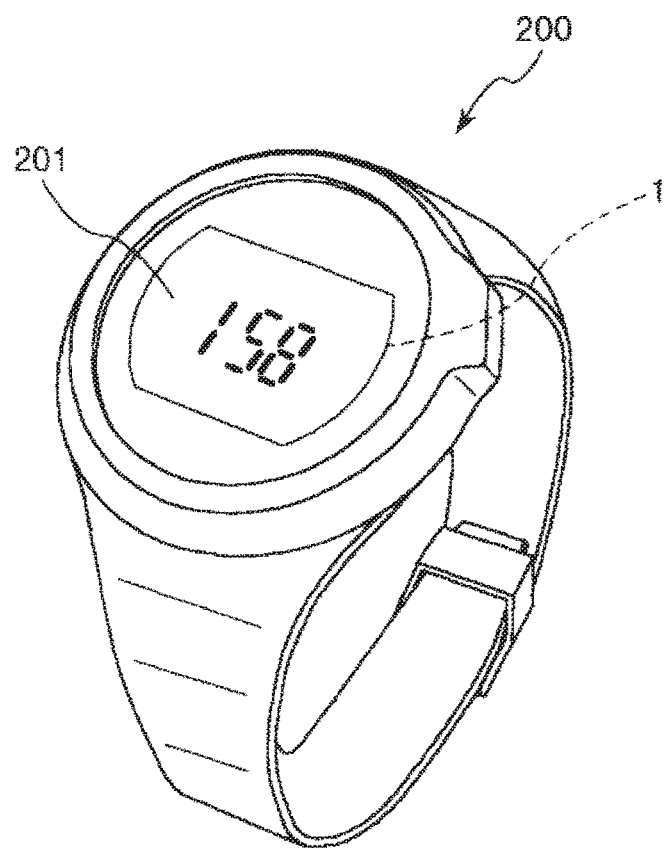
FIG. 11 is a perspective view showing an example of an altimeter according to the invention.

Next, an example of an altimeter (altimeter according to the invention) including the pressure sensor element according to the invention will be described. FIG. 11 is a perspective view showing an example of the altimeter according to the invention.

An altimeter 200 can be worn on the wrist like a wristwatch. The pressure sensor element 1 (the pressure sensor 100) is mounted in the interior of the altimeter 200, so that the altitude of a current location above sea level, the air pressure at the current location, and the like can be displayed on a display portion 201.

On the display portion 201, various information such as a current time, a user's heart rate, and weather can be displayed.

4. Electronic Apparatus

Figure 12:
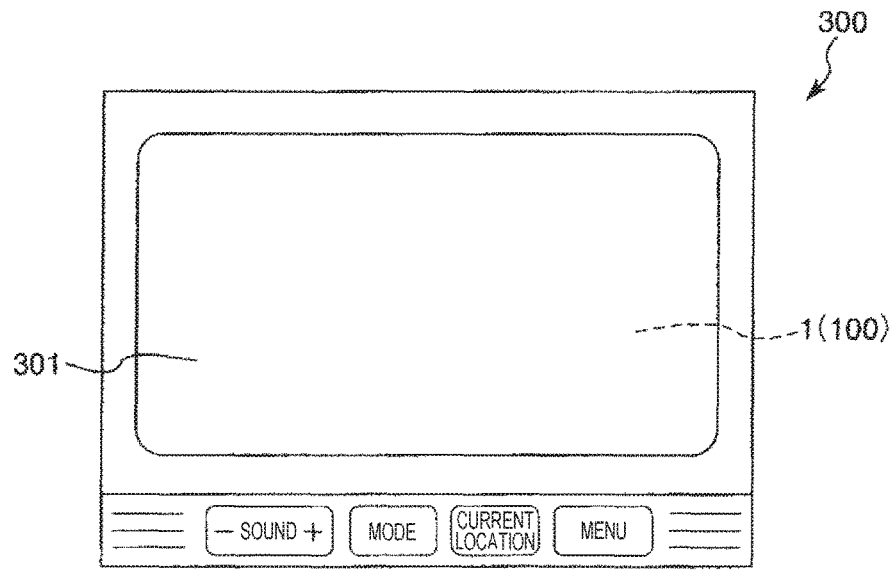
FIG. 12 is an elevation view showing an example of an electronic apparatus according to the invention.

Next, a navigation system to which an electronic apparatus including the pressure sensor element according to the invention is applied will be described. FIG. 12 is an elevation view showing an example of the electronic apparatus according to the invention.

A navigation system 300 includes map information (not shown), a position information acquiring unit that acquires position information from a global positioning system (GPS), a self-contained navigation unit using a gyro sensor, an acceleration sensor, and vehicle speed data, the pressure sensor element 1, and a display portion 301 that displays predetermined position information or route information.

According to the navigation system, altitude information can be acquired in addition to acquired position information. Obtaining the altitude information enables the following: for example, when a car runs on an elevated road indicated on the position information at substantially the same position as an open road, the navigation system cannot determine, in the absence of altitude information, whether the car runs on the open road or the elevated road, and therefore, the navigation system provides the user with information on the open road as preferential information; while, in the navigation system 300 according to this embodiment, altitude information can be acquired by the pressure sensor element 1, a change in altitude due to the car entering the elevated road from the open road is detected, and it is possible to provide the user with navigation information in a running state on the elevated road.

The display portion 301 is composed of, for example, a liquid crystal panel display or an organic electro-luminescence (EL) display, so that the miniaturization and thinning thereof are possible.

The electronic apparatus including the pressure sensor element according to the invention is not limited to that described above, and can be applied to, for example, a personal computer, a mobile phone, a medical apparatus (e.g., an electronic thermometer, a sphygmomanometer, a blood glucose meter, an electrocardiogram measuring system, an ultrasonic diagnosis apparatus, and an electronic endoscope), various kinds of measuring instrument, indicators (e.g., indicators used in a vehicle, aircraft, and a ship), and a flight simulator.

5. Moving Object

Figure 13:
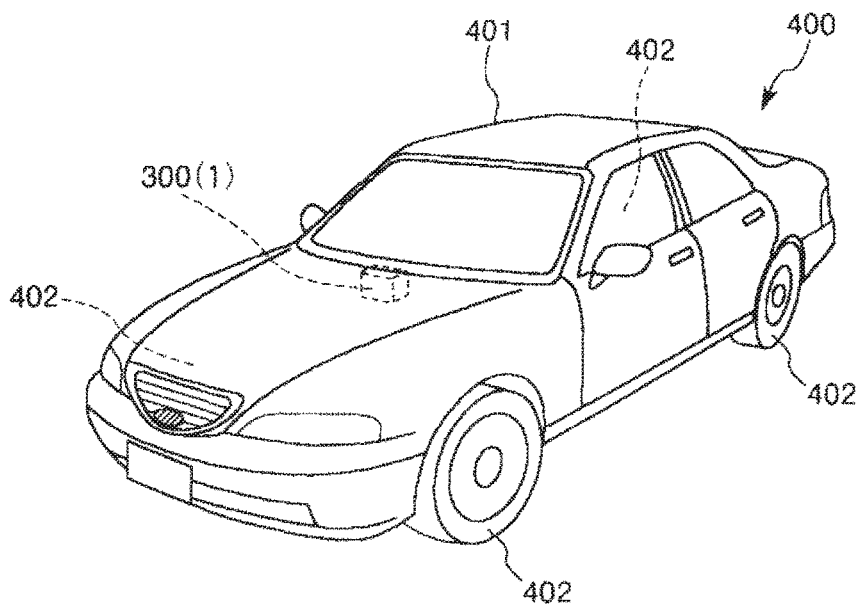
FIG. 13 is a perspective view showing an example of a moving object according to the invention.

Next, a moving object (moving object according to the invention) to which the pressure sensor element according to the invention is applied will be described. FIG. 13 is a perspective view showing an example of the moving object according to the invention.

As shown in FIG. 13, a moving object 400 includes a car body 401 and four wheels 402, and is configured to rotate the wheels 402 with a source of power (engine; not shown) provided in the car body 401. Into the moving object 400, the navigation system 300 (the pressure sensor element 1) is built.

The pressure sensor element, the pressure sensor, the altimeter, the electronic apparatus, and the moving object according to the invention have been described above based on the embodiments shown in the drawings, but the invention is not limited to them. The configuration of each part can be replaced with any configuration having a similar function. Moreover, any other component may be added.

Although an example in which the number of piezoresistive elements (functional elements) provided in one diaphragm portion is four has been described in the embodiment described above, the number is not limited to the example. For example, the number of piezoresistive elements may be from one to three, or five or more. Moreover, the arrangement, shape, or the like of the piezoresistive elements is not limited to the embodiment described above, and, for example, the piezoresistive element may be disposed at the central portion of the diaphragm portion in the embodiment described above.

What is claimed is:
1. A pressure sensor element comprising a diaphragm portion, the diaphragm portion including:
  a first silicon layer,
  a resistive region provided in the first silicon layer, and
  a second silicon layer on the resistive region, the second silicon layer being single crystal silicon,
  wherein a thickness of the second silicon layer is in the range of 0.05 to 0.4 µm, a total thickness of the resistance region is in the range of 0.1 to 0.5 µm, and the thickness of the resistance region is in the range of 5% to 30% of a thickness of the diaphragm portion, and
  a distance between a peak position of a carrier concentration of the resistive region at which the carrier concentration is greatest and a surface of the first silicon layer is in the range of 0.05 to 0.25 µm.

2. The pressure sensor element according to claim 1, further comprising a pressure reference chamber.

3. A pressure sensor comprising the pressure sensor element according to claim 2.

4. An altimeter comprising the pressure sensor element according to claim 2.

5. An electronic apparatus comprising the pressure sensor element according to claim 2.

6. A moving object comprising the pressure sensor element according to claim 2.

7. The pressure sensor element according to claim 1, wherein
  a thickness of the diaphragm portion is in the range of 0.5 to 15 µm.

8. A pressure sensor comprising the pressure sensor element according to claim 7.

9. The pressure sensor element according to claim 1, further comprising a substrate including the diaphragm portion and a circuit portion.

10. A pressure sensor comprising the pressure sensor element according to claim 1.

11. An altimeter comprising the pressure sensor element according to claim 1.

12. An electronic apparatus comprising the pressure sensor element according to claim 1.

13. A moving object comprising the pressure sensor element according to claim 1.

14. The pressure sensor element according to claim 1, further comprising a reference chamber, wherein the reference chamber includes interior surfaces that are formed of a conductive material electrically connected to the resistive region.

15. The pressure sensor element according to claim 1, further comprising a reference chamber, wherein the reference chamber is covered by a stacked structure including a covering layer having a plurality of fine pores.

16. A pressure sensor element comprising:
  a substrate including a diaphragm portion; and
  a circuit,
  wherein the diaphragm portion includes:
    a first silicon layer,
    a resistive region provided in the first silicon layer,
    a wire connected to the resistive region, and
    a second silicon layer on the resistive region and the wire,
    wherein a thickness of the second silicon layer is in the range of 0.05 to 0.4 µm, and a total thickness of the resistance region is in the range of 0.1 to 0.5 µm;
  a thickness of the wire in a cross-sectional view is less than a thickness of the resistive region, and
  a distance between a peak position of a carrier concentration of the resistive region at which the carrier concentration is greatest and a surface of the first silicon layer is in the range of 0.05 to 0.25 µm.

17. The pressure sensor element according to claim 16, further comprising a reference chamber, wherein the reference chamber includes interior surfaces that are formed of a conductive material electrically connected to the resistive region.

18. The pressure sensor element according to claim 16, further comprising a reference chamber, wherein the reference chamber is covered by a stacked structure including a covering layer having a plurality of fine pores.

* * * * *